(12) United States Patent
Lim et al.

(10) Patent No.: US 7,615,830 B2
(45) Date of Patent: Nov. 10, 2009

(54) TRANSISTORS WITH MULTILAYERED DIELECTRIC FILMS

(75) Inventors: Ha-Jin Lim, Seoul (KR); Jong-Ho Lee, Gyeonggi-do (KR); Hyung-Suk Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 425 days.

(21) Appl. No.: 11/252,514

(22) Filed: Oct. 18, 2005

(65) Prior Publication Data

US 2006/0081948 A1  Apr. 20, 2006

(30) Foreign Application Priority Data

Oct. 19, 2004  (KR) .................. 10-2004-0083595

(51) Int. Cl.
*H01L 21/8238* (2006.01)
(52) U.S. Cl. .................. 257/411; 257/E21.28; 438/591
(58) Field of Classification Search .................. 257/411, 257/E21.28; 438/591
See application file for complete search history.

(56) References Cited

U.S. PATENT DOCUMENTS

| | | | |
|---|---|---|---|
| 5,783,478 A * | 7/1998 | Chau et al. .................. 438/592 |
| 6,664,186 B1 * | 12/2003 | Callegari et al. ............ 438/681 |
| 6,844,604 B2 | 1/2005 | Lee et al. .................... 257/410 |
| 6,933,569 B2 * | 8/2005 | Koh et al. .................... 257/347 |
| 6,946,351 B2 * | 9/2005 | Yoshida et al. .............. 438/285 |
| 7,242,055 B2 * | 7/2007 | Bojarczuk et al. ........... 257/324 |
| 2002/0175384 A1 * | 11/2002 | Ngai et al. ................... 257/408 |
| 2003/0003667 A1 * | 1/2003 | Morisaki et al. ............ 438/287 |
| 2005/0280104 A1 * | 12/2005 | Li ............................... 257/406 |

FOREIGN PATENT DOCUMENTS

| | | |
|---|---|---|
| JP | 2002314072 | 10/2002 |
| JP | 2003008004 | 1/2003 |
| KR | 1020040002818 | 1/2004 |

* cited by examiner

*Primary Examiner*—Trung Dang
(74) *Attorney, Agent, or Firm*—Myers Bigel Sibley & Sajovec

(57) ABSTRACT

Transistors that include multilayered dielectric films on a channel region are provided. The multilayered dielectric comprises a lower dielectric film that may have a thickness that is at least 50% the thickness of the multilayered dielectric film and that comprises a metal oxide, a metal silicate, an aluminate, or a mixture thereof, and an upper dielectric film on the lower dielectric film, the upper dielectric film comprising a Group III metal oxide, Group III metal nitride, Group XIII metal oxide or Group XIII metal nitride. A gate electrode is provided on the multilayered dielectric film.

16 Claims, 7 Drawing Sheets

TRANSISTORS WITH MULTILAYERED DIELECTRIC FILMS

CROSS-REFERENCE TO RELATED PATENT APPLICATION

This application claims priority under 35 U.S.C. § 119 from Korean Patent Application No. 10-2004-0083595, filed on Oct. 19, 2004, in the Korean Intellectual Property Office, the disclosure of which is incorporated herein in its entirety by reference.

FIELD OF THE INVENTION

The present invention relates to transistors with improved characteristics and reliability and methods of manufacturing such transistors.

BACKGROUND

Typically, the gate dielectric films of Metal Oxide Semiconductor (MOS) transistors are formed to be very thin, as the driving current of a MOS transistor may increase as the thickness of the gate dielectric film decreases. Thermal oxide films such as, for example, thermal silicon oxide films have been used as gate dielectric films since they typically do not adversely affect an underlying silicon substrate, and can be formed in a simple manner. However, silicon oxide films have a relatively low dielectric constant of, for example, about 3.9. Consequently, reductions in the thickness of a silicon oxide film used as a gate dielectric film may result in a higher gate leakage current. As a result, the degree to which the thickness of silicon oxide gate dielectric film may be reduced is restricted.

High dielectric constant or "high-k" dielectric films have also been used as gate dielectric films. While such high-k dielectric films are typically thicker than a silicon oxide film, they can still, in certain situations, improve device performance. There has been significant research into the use of high dielectric constant (high-k) dielectric films such as, for example, single metal oxide films made of hafnium oxide or zirconium oxide, metal silicate films made of hafnium silicate or zirconium silicate, and aluminate films made of hafnium aluminum oxide.

A pMOS device that includes a hafnium-based or zirconium-based dielectric film may exhibit a threshold voltage that is for example, 0.3-0.6V higher than the threshold voltage of a pMOS device that instead uses a silicon oxinitride (SiON) dielectric film. As the upper limit of the threshold voltage of a pMOS device which can be adjusted by channel engineering may be on the order of 0.1 to 0.2V, formation of a high-k dielectric film using conventional device fabrication processes may make it difficult to adjust a device threshold voltage to a desired level. In addition, when a polysilicon gate electrode is formed directly on a high-k dielectric film, gate depletion and/or degradation of the PBTI (Positive Bias Temperature Instability) characteristics of an nMOS device may result.

SUMMARY

Pursuant to certain embodiments of the present invention, transistors are provided which include a multilayered dielectric film on a channel region, the multilayered dielectric film comprising a lower dielectric film having a thickness that is at least 50% a thickness of the multilayered dielectric film. The lower dielectric film comprises a metal oxide, a metal silicate and/or an aluminate. The lower dielectric film may also include nitrogen. An upper dielectric film is provided on the lower dielectric film. The upper dielectric film comprises a Group III metal oxide, a Group III metal nitride, a Group XIII metal oxide or a Group XIII metal nitride. A gate electrode is further provided on the multilayered dielectric film.

In certain embodiments where the lower dielectric film comprises a metal silicate, the metal silicate can be represented by $M_{1-x}Si_xO_2$ where x has a value between 0.1 and 0.99 and M is hafnium, zirconium, tantalum, titanium, strontium, barium, scandium, yttrium or lanthanum. In certain specific embodiments, the metal silicate is hafnium silicate ($Hf_{1-x}Si_xO_2$) and/or x has a value between 0.1 and 0.5. In other specific embodiments, the upper dielectric film comprises aluminum oxide.

In some embodiments, the gate electrode is a multilayered gate electrode that includes a metal nitride or a metal silicon nitride lower gate electrode and a polysilicon or polycide upper gate electrode on the lower gate electrode. A $SiO_2$ film or a SiON film may be provided on a lower surface of the lower dielectric film. In other embodiments, the gate electrode is a multilayered gate electrode that includes a metal, metal nitride or metal silicon nitride lower gate electrode and a polysilicon, metal, metal silicide, or polycide upper gate electrode on the lower gate electrode. In still other embodiments, the gate electrode is a monolayered metal, metal nitride, metal silicon nitride or metal silicide gate electrode.

Pursuant to further embodiments of the present invention, transistors are provided that include a multilayered dielectric film on a channel region defined between a source region and a drain region. The multilayered dielectric film may include a lower dielectric film comprising a silicate of a first metal and an upper dielectric film on the lower dielectric film, the upper dielectric film comprising a silicate of the first metal and a Group III or Group XIII metal. A gate electrode is provided on the multilayered dielectric film.

Methods of manufacturing the transistors according to embodiments of the present invention are also provided.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1A:
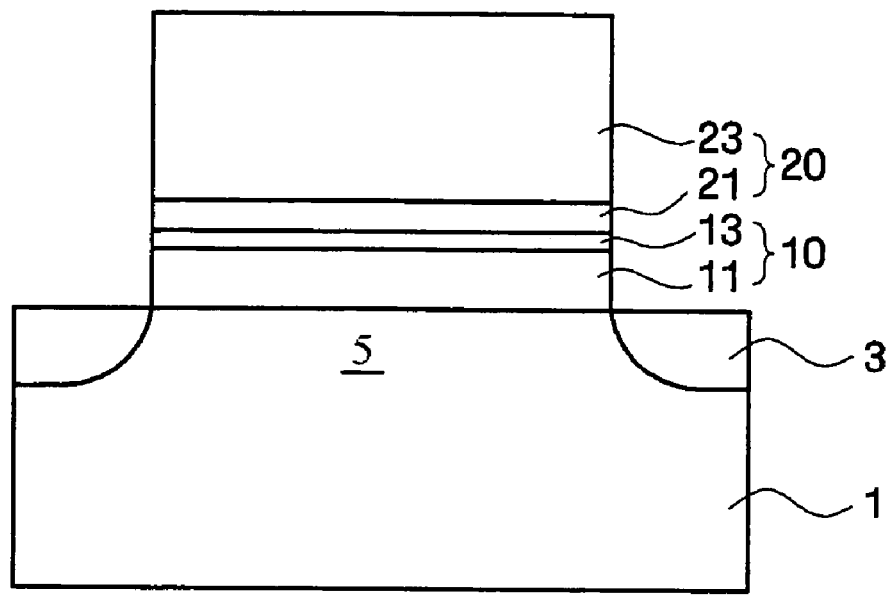
FIG. 1A is a cross-sectional diagram of transistors according to first embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing, as the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Transistors according to embodiments of the present invention can be used, for example, in volatile memory devices such as DRAMs (Dynamic Random Access Memories) or SRAMs (Static Random Access Memories), nonvolatile memory devices such as EEPROMs (Electrically Erasable Programmable Read-Only Memories), flash memory devices, MEMS (Micro Electro Mechanical System) devices, optoelectronic devices, display devices and a wide range of other applications. Transistors according to embodiments of the present invention may be formed, for example, on Si, Ge, SiGe, GaP, GaAs, SiC, SiGeC, InAs, and InP semiconductor substrates, or on SOI (Silicon On Insulator), ceramic, quartz or other substrates. These examples of substrates are for illustrative purposes only. Thus, while the following embodiments will be described in terms of silicon substrates, it will be understood that the transistors may be implemented on a wide variety of different types of substrates.

Transistors according to embodiments of the present invention include a multilayered dielectric film. Exemplary embodiments of the present invention are explained herein with reference to FIGS. 1A through 1C, which are cross-sectional diagrams illustrating, respectively, transistors according to first through third embodiments of the present invention.

As shown in FIG. 1A, transistors according to the first embodiments of the present invention may include a multi-layered dielectric film 10 that is formed on a channel region 5. The channel region 5 may be defined by source/drain regions 3 that are formed in a substrate 1. A multilayered gate electrode 20 is formed on the multilayered dielectric film 10. The substrate 1 may, for example, comprise a polished silicon substrate, an epitaxially grown monocrystalline substrate, or a SOI substrate.

As shown in FIG. 1A, the multilayered dielectric film 10 may have a double layer structure comprising a lower dielectric film 11 and an upper dielectric film 13. The thickness of the lower dielectric film 11 may be 50% or more the total thickness of the multilayered dielectric film 10. Such a thickness ratio may, in certain situations, facilitate optimizing the dielectric constant and leakage current characteristics of the multilayered dielectric film 10. The lower dielectric film 11 may be made of a material having a higher dielectric constant than silicon oxide, silicon nitride, and silicon oxinitride. Thus, for example, the lower dielectric film 11 may comprise a metal oxide film, a metal silicate film, an aluminate film, or a mixture thereof. The lower dielectric film 11 may also be a laminate made of metal oxide, metal silicate, aluminate, or a mixture thereof. The lower dielectric film 11 may also comprise a nitride of the above-described materials.

Suitable metal oxides that may be used for the lower dielectric film 11 include hafnium oxide (HfO2), zirconium oxide ($ZrO_2$), tantalum oxide ($Ta_2O_5$), titanium oxide ($TiO_2$), aluminum oxide ($Al_2O_3$), a lanthanoid oxide such as lanthanum oxide ($La_2O_3$) or gadolinium oxide ($Gd_2O_3$), yttrium oxide ($Y_2O_3$), etc. Suitable metal silicates that may be used for the lower dielectric film 11 include materials represented by $M_{1-x}Si_xO_2$ where x is 0.1-0.99 and M is hafnium (Hf), zirconium (Zr), tantalum (Ta), titanium (Ti), strontium (Sr), barium (Ba), scandium (Sc), yttrium (Y) or lanthanum (La). Suitable aluminates that may be used for the lower dielectric film 11 include materials represented by $M'_xAl_yO_z$ where M' is hafnium (Hf), zirconium (Zr), tantalum (Ta), titanium (Ti), strontium (Sr), barium (Ba), scandium (Sc), yttrium (Y) or lanthanum (La). It will be understood that embodiments of the present invention are not limited to the above-listed examples.

As noted above, the lower dielectric film 11 may comprise a metal silicate such as, for example, hafnium silicate ($Hf_{1-x}Si_xO_2$). A lower dielectric film 11 made of metal silicate may have good relatively coherency with a channel region 5 made of silicon, a small interface trap density (Dit), and higher negative formation heat than a silicon oxide film to render the lower dielectric film 11 chemically stable during a formation process. As a result, an interface layer may not be necessary and the equivalent oxide film thickness may be increased. Additionally, with a metal silicate lower dielectric film 11, it may be possible to maintain the metal silicate in an amorphous phase even after subsequent high-temperature annealing processes, thereby reducing and/or preventing the formation of grain boundaries which may allow current flow.

The dielectric constant of the metal silicate can be adjusted by adjusting the value of the term 1-x that represents the composition ratio of the metal. In certain embodiments of the present invention, the value of 1-x may, for example, be in a range from 0.5 to 0.9 to optimize the dielectric constant of the lower dielectric film 11. However, it should be understood that the value of 1-x is not limited to the above range.

The lower dielectric film 11 may have a thickness in which the above-described characteristics and leakage current characteristics are satisfied while the dielectric constant of the multilayered dielectric film 10 is increased and/or maximized. In certain embodiments of the present invention, the lower dielectric film 11 may have a thickness of about 60 Angstroms or less.

The upper dielectric film 13 may comprise a material that may adjust the threshold voltage (Vth) of an nMOS or pMOS device that may be changed by the lower dielectric film 11. The upper dielectric film 13 may also comprise a material that maintains an amorphous phase even during subsequent high-temperature annealing processes which may reduce and/or prevent the formation of grain boundaries that may allow current flow. For example, the upper dielectric film 13 may comprise a Group III metal oxide or nitride or a Group XIII metal oxide or nitride. Examplary Group III or Group XIII metal oxides include aluminum oxide, lanthanoid oxide and yttrium oxide. Examplary Group III or Group XIII metal nitrides include aluminum nitride, lanthanoid nitride and yttrium nitride. When both the lower dielectric film 11 and the upper dielectric film 13 are made of metal oxide, the metal constituting the lower dielectric film 11 may be different from the metal constituting the upper dielectric film 13.

The threshold voltage adjustment by the Group III metal oxide, Group III metal nitride, Group XIII metal oxide or Group XIII metal nitride can be explained by a fixed charge model or a Fermi-level pinning model. According to the fixed charge model, negative fixed charges in a thin film made of a Group III or Group VIII metal oxide or metal nitride permits a threshold voltage shift to a positive direction to thereby increase the threshold voltage of an nMOS device and decrease the threshold voltage of a pMOS device. According to the Fermi-level pinning model, a Fermi-level pinning position near the conduction band (Ec) of a gate electrode, e.g., a polysilicon electrode, shifts downward by insertion of a thin film made of a Group III or Group VIII metal oxide or metal nitride to thereby increase the effective work function of the gate electrode, resulting in an increase in the threshold voltage of an nMOS device and a decrease in the threshold voltage of a pMOS device. The threshold voltage adjustment by the upper dielectric film 13 may also be explained by any suitable model, in addition to the above models.

To optimize the threshold voltage of nMOS and pMOS devices, the upper dielectric film 13 may be a thin film. In embodiments of the present invention, the upper dielectric film 13 may have a thickness of about 10 Angstroms or less.

The multilayered gate electrode 20 may have a double layer structure including a lower gate electrode 21 and an upper gate electrode 23. The lower gate electrode 21 may be a conductive thin film capable of reducing and/or preventing degradation of PBTI characteristics, gate depletion, etc. The lower gate electrode 21 may be made of a material that can reduce and/or prevent the diffusion of dopants in the upper gate electrode 23 and/or charge trapping. By way of example, the lower gate electrode 21 may be made of a metal such as, for example, tungsten, molybdenum, titanium, tantalum, hafnium, zirconium and/or aluminum, and/or of a metal nitride such as, for example, tungsten nitride, molybdenum nitride, titanium nitride, tantalum nitride, hafnium nitride, zirconium nitride, aluminum nitride and/or tantalum silicon nitride. The lower gate electrode 21 may, for example, be formed to a thickness of about 100 Angstroms or less.

The upper gate electrode 23 may be made, for example, of polysilicon; a metal such as tungsten, molybdenum, titanium, tantalum, hafnium, zirconium or aluminum; a metal silicide; or polycide. Considering compatibility with a CMOS process, polysilicon and polycide may be particularly suitable materials for the upper gate electrode 23 in certain embodiments of the present invention.

Figure 1B:
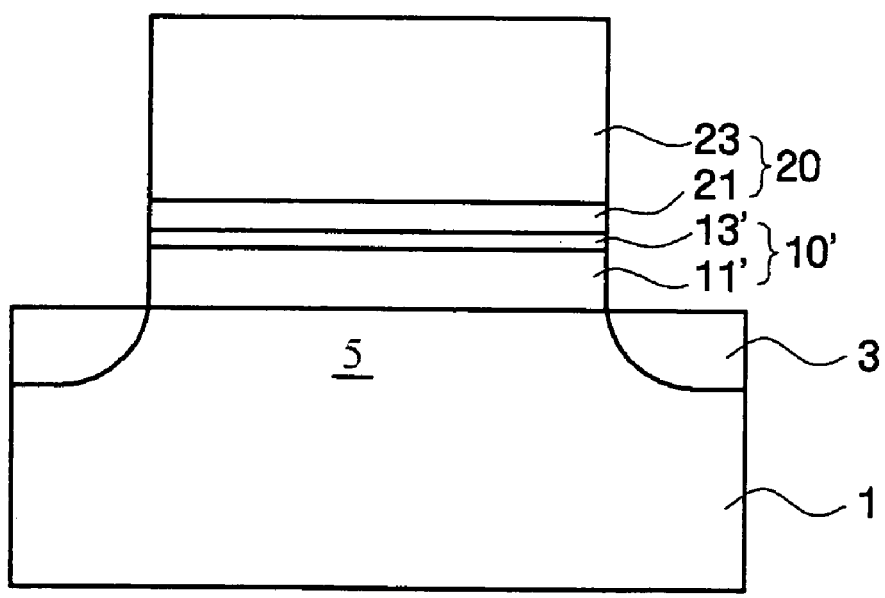
FIG. 1B is a cross-sectional diagram of transistors according to second embodiments of the present invention.

As shown in FIG. 1B, transistors according to the second embodiments of the present invention include a multilayered dielectric film 10' including a lower dielectric film 11' and an upper dielectric film 13'. The lower dielectric film 11' and the upper dielectric film 13' may be formed by substantially stacking a metal silicate dielectric film (see 11 of FIG. 1A) and a Group III or XIII metal oxide or nitride dielectric film (see 13 of FIG. 1A) followed by annealing so that constitutional elements of the metal silicate dielectric film diffuse toward the Group III or XIII metal oxide or nitride dielectric film. Like in the first embodiment shown in FIG. 1A, the thickness of the lower dielectric film 11' may be 50% or more the total thickness of the multilayered dielectric 10'.

The lower dielectric film 11' may comprise a metal silicate. Like in the first embodiment, the metal silicate may be a material represented by $M_{1-x}Si_xO_2$ where x is 0.1-0.99 and M is hafnium (Hf), zirconium (Zr), tantalum (Ta), titanium (Ti), strontium (Sr), barium (Ba), scandium (Sc), yttrium (Y) and/or lanthanum (La) and/or other metal silicates. In certain embodiments of the present invention, the value of 1-x may be in a range from 0.5 to 0.9 to increase and/or optimize the dielectric constant of the lower dielectric film 11'. However, the value of 1-x is not limited to this range.

The upper dielectric film 13' may be made of a silicate formed using metal and silicon that is diffused from the lower dielectric film 11'. For example, the upper dielectric film 13' may comprise a silicate of the metal constituting the lower dielectric film 11' and a Group III or XIII metal that is different from the metal constituting the lower dielectric film 11'. In certain embodiments of the present invention, the upper dielectric film 13' may be made of hafnium aluminum silicate, hafnium lanthanum silicate, hafnium yttrium silicate, hafnium gadolinium silicate, zirconium aluminum silicate, zirconium lanthanum silicate, zirconium yttrium silicate, zirconium gadolinium silicate, tantalum aluminum silicate, tantalum lanthanum silicate, tantalum yttrium silicate, tantalum gadolinium silicate, titanium aluminum silicate, titanium lanthanum silicate, titanium yttrium silicate, titanium gadolinium silicate, strontium aluminum silicate, strontium lanthanum silicate, strontium yttrium silicate, strontium gadolinium silicate, barium aluminum silicate, barium lanthanum silicate, barium yttrium silicate, barium gadolinium silicate, scandium aluminum silicate, scandium lanthanum silicate, scandium yttrium silicate, scandium gadolinium silicate, yttrium aluminum silicate, yttrium lanthanum silicate, yttrium gadolinium silicate, lanthanum aluminum silicate, lanthanum yttrium silicate and/or lanthanum gadolinium silicate. The upper dielectric film 13' may further include nitrogen, in addition to the above material.

The gate electrode 20 of the transistors according to the second embodiments of the present invention may have a double layer structure composed of a lower gate electrode 21 and an upper gate electrode 23, as in the first embodiment. The lower gate electrode 21 and the upper gate electrode 23 are as described above in the first embodiment, and thus a detailed description thereof will be omitted.

Figure 1C:
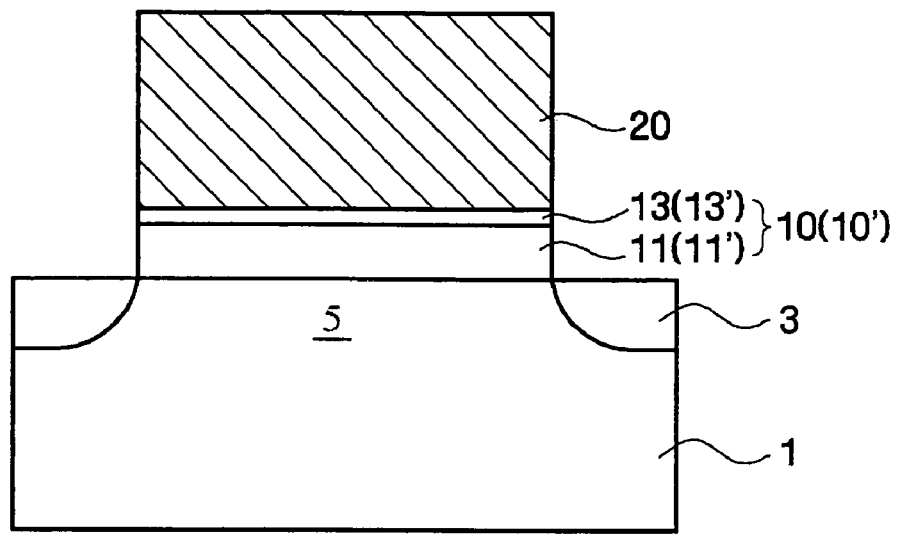
FIG. 1C is a cross-sectional diagram of transistors according to third embodiments of the present invention.

FIG. 1C is a cross-sectional diagram illustrating transistors according to third embodiments of the present invention. The third embodiments are substantially the same as the first and second embodiments except that a monolayered gate electrode 20 is used. That is, the transistors according to the third embodiments have the structure where the monolayered gate electrode 20 is formed on a multilayered dielectric film 10 or 10' as described in the first or second embodiments. The multilayered dielectric films 10 and 10' are as described above in the first and second embodiments and thus a detailed description thereof will be omitted.

The monolayered gate electrode 20 may be made of a material capable of reducing and/or preventing degradation of PBTI characteristics and gate depletion. Thus, the gate electrode 20 may be made, for example, of a metal, metal nitride, or metal silicide. The metal may, for example, be tungsten, molybdenum, titanium, tantalum, hafnium, zirconium and/or aluminum, the metal nitride may, for example, be a nitride of any of the above listed metals and/or tantalum silicon nitride, and the metal silicide may, for example, be a silicide of any of the above-listed metals.

Although not shown in FIGS. 1A through 1C, a silicon oxide ($SiO_2$) film or a silicon oxinitride (SiON) film may also be formed on a lower surface of the lower dielectric film 11 or 11'. Silicon oxide films and silicon oxinitride films may have excellent coherency with the silicon substrate 1 and thus may be included to further enhance the coherency between the lower dielectric film 11 or 11' and the silicon substrate 1. The silicon oxide film may be a natural oxide film. The silicon oxide film may also be an artificial oxide film formed, for example, by rapid thermal oxidation, wet oxidation, etc.

Hereinafter, exemplary methods of manufacturing the transistors illustrated in FIGS. 1A through 1C will be described.

First, the substrate 1 with the channel region 5 is prepared. Then, the lower dielectric film 11 is formed on the channel region 5.

When the lower dielectric film 11 comprises a metal oxide, the film may be formed at low-temperatures using an ALD (Atomic Layer Deposition) process. Use of the ALD process may enable precise control of the film thickness and the use of various precursors. The ALD process may be done by repeating a cycle in which a metal source is supplied, a purge gas is supplied, an oxygen source is supplied, and a purge gas is again supplied to thereby form a metal oxide film with a thickness of, for example, about 60 Angstroms or less. When the metal oxide film is formed as, for example, a $HfO_2$ or $ZrO_2$ film, the metal sources presented in Table 1 below may be used.

TABLE 1

|  | Hf | Zr |
|---|---|---|
| Halide | $HfCl_4$ | $ZrCl_4$ |
| Alkoxide | $Hf(OtC_4H_9)_4$ | $Zr(OtC_4H_9)_4$ |
|  | $Hf(OC_2H_5)_4$ |  |
| Amide | $Hf(N(C_2H_5)_2)_4$ | $Zr(N(C_2H_5)_2)_4$ |
|  | $Hf(N(CH_3)_2)_4$ | $Zr(N(CH_3)_2)_4$ |
|  | $Hf(N(CH_3C_2H_5)_4$ | $Zr(N(CH_3C_2H_5))_4$ |
| Alkoxyamine | $Hf(dmae)_4$ | $Zr(dmae)_4$ |
| Others |  |  | dmae: dimethylaminoethanol

An oxygen source may, for example, be $H_2O$, $O_3$, oxygen radical, alcohol (e.g.: isopropylalcohol), $D_2O$, or $H_2O_2$.

The metal oxide film may also be formed, for example, by Chemical Vapor Deposition (CVD), Metal-Organic CVD (MOCVD) or reactive sputtering. When the MOCVD technology is used, Hf-t-butoxide may be used as a hafnium source and Zr-t-butoxide may be used as a zirconium source.

When the lower dielectric film 11 comprises a metal silicate, the film may again be formed by a low-temperature ALD process. Use of an ALD process may facilitate precisely controlling the film thickness and silicon composition using various precursors. The ALD process may be performed by repeating a cycle comprising supplying a metal gas, followed by a purge gas, followed by a silicon gas, followed by a purge gas, followed by an oxygen gas, followed by a purge gas. Alternatively a first cycle of supplying a metal gas, followed by a purge gas, followed by an oxygen gas, followed by a purge gas, and then a second cycle comprising supplying a silicon gas, followed by a purge gas, followed by an oxygen gas, followed by a purge gas may be repeated to thereby form a metal silicate film with a thickness of, for example, about 60 Angstroms or less.

When the metal silicate film is formed as a $Hf_{1-x}Si_xO_2$ or $Zr_{1-x}Si_xO_2$ film, metal sources and silicon sources presented in Table 2 below may be used.

TABLE 2

|  | Hf | Zr | Si |
|---|---|---|---|
| Halide | $HfCl_4$ | $ZrCl_4$ | $SiCl_4$ |
| Alkoxide | $Hf(OtC_4H_9)_4$ | $Zr(OtC_4H_9)_4$ | $Si(OC_4H_9)_4$ |
|  | $Hf(OC_2H_5)_4$ |  | $Si(OCH_3)_4$ |
|  |  |  | $Si(OC_2H_5)_4$ |
| Amide | $Hf(N(C_2H_5)_2)_4$ | $Zr(N(C_2H_5)_2)_4$ | $Si(N(C_2H_5)_2)_4$ |
|  | $Hf(N(CH_3)_2)_4$ | $Zr(N(CH_3)_2)_4$ | $Si(N(CH_3)_2)_4$ |
|  | $Hf(N(CH_3C_2H_5))_4$ | $Zr(N(CH_3C_2H_5))_4$ | $Si(N(CH_3C_2H_5))_4$ |
| Alkoxyamine | $Hf(dmae)_4$ | $Zr(dmae)_4$ | $Si(dmae)_4$ |
| Others |  |  | $SiH_4$, $SiCl_4H_2$ | dmae: dimethylaminoethanol

An oxygen source may, for example, be $H_2O$, $O_3$, oxygen radical, alcohol (e.g., isopropylalcohol), $D_2O$, or $H_2O_2$. It will be understood that other precursors may also be used.

Provided that the thickness and composition of the metal silicate film can be sufficiently controlled, CVD, MOCVD or reactive sputtering technology or other processes may alternatively be used to form the metal silicate film. The MOCVD may be performed using precursors such as, for example, HF(O—Si—R$_3$)$_4$ or Zr(O—Si—R$_3$)$_4$ where R is C$_2$H$_5$. In addition, Hf-t-butoxide may be used, for example, as a hafnium source and Zr-t-butoxide may be used, for example, as a zirconium source. The silicon source may, for example, be tetraethoxyorthosilane or tetraethylorthosilicate.

The metal silicate film may also be formed by forming a thin metal oxide film that has a thickness which is less than the thickness at which crystallization of metal oxide starts to occur, followed by thermal treatment of the thin metal oxide film. A method related thereto is disclosed in Korean Patent Application No. 2004-0073078 commonly assigned to the present applicant, the disclosure of which is incorporated herein in its entirety by reference.

A lower dielectric film 11 that is made of aluminate (M'$_x$Al$_y$O$_z$) may also be formed by a low-temperature ALD process using various precursors. When an ALD process is used to form an aluminate lower dielectric film 11, the repetition ratio of an aluminum supply cycle comprising aluminum source gas supply, purge gas supply, oxygen source gas supply, and purge gas supply and a metal supply cycle comprising metal source gas supply, purge gas supply, oxygen source gas supply, and purge gas supply may be chosen based on, for example, the crystallization temperature of the material formed (i.e., it may be sufficiently high to maintain the material in an amorphous state), reduction and/or minimization of the amount of pure fixed charges, and/or increase and/or maximization of the dielectric constant. The repetition of these ALD cycles may be used to form an aluminate film with a thickness, for example, of about 60 Angstroms or less.

The thickness of the lower dielectric film 11 may be determined based on, for example, the effect on total capacitance of the multilayered dielectric film 10 and/or the leakage current characteristics. The lower dielectric film 11 may be formed, for example, to a thickness of about 60 Angstroms or less. If the thickness is greater than about 60 Angstroms, a popping phenomenon may occur in certain instances in a subsequent annealing process. In particular, as is well known in the art, hydroxyl neutrons trapped in a high-k dielectric film can cause an explosion phenomenon during an annealing process, which may damage the dielectric film and thus a popping phenomenon in which holes are formed in the dielectric film.

Following formation of the lower dielectric film 11, the resultant structure may be thermally treated. The thermal treatment may be performed, for example, by simple thermal treatment, thermal nitridation, thermal oxidation or a combination thereof.

The simple thermal treatment may be performed in an inert gas atmosphere or vacuum atmosphere. The inert gas may be, for example, Ar, He, N$_2$, D$_2$, H$_2$ or a combination thereof.

The thermal nitridation may be performed in a nitrogen atmosphere. The thermal nitridation may be, for example, plasma nitridation such as direct plasma nitridation, remote plasma nitridation and/or NH$_3$ plasma nitridation. The thermal nitridation may also be a rapid thermal process in a NH$_3$, NO and/or N$_2$O atmosphere.

The thermal oxidation may be performed in an oxygen atmosphere. The thermal oxidation may be, for example, a dry oxidation process using N$_2$O, NO and/or O$_2$; an annealing process using O$_3$; an oxidation process using oxygen radical or O$_2$ plasma; and/or a wet oxidation process using H$_2$O, ISSG (In-Situ Steam Generation) and/or WVG (Water Vapor Generation).

The thermal treatment process may be performed in RTP (Rapid Thermal Process) equipment. RTO (Rapid Thermal Oxidation) after RTN (Rapid Thermal Nitridation) may be an efficient method for performing the thermal treatment process.

Next, the upper dielectric film 13 is formed on the lower dielectric film 11. The upper dielectric film 13 may be formed as a thin film to improve and/or optimize the threshold voltage of nMOS and pMOS devices. In embodiments of the present invention, the upper dielectric film 13 may be formed to a thickness of about 10 Angstroms or less. The upper dielectric film 13 may be formed using an ALD process.

The ALD process for forming the upper dielectric film 13 may be performed, for example, by repeating a cycle comprising supplying a Group III metal gas, followed by a purge gas, followed by an oxygen gas, followed by a purge gas. The upper dielectric film 13 may be formed to a thickness of about 10 Angstroms or less by adjusting the cycle number or process duration of the source and purge gas supply processes. When the upper dielectric film 13 is formed as an aluminum oxide film, TMA (trimethylaluminum) may be used as an aluminum source and ozone may be used as an oxygen source.

Next, the resultant structure having the upper dielectric film 13 is annealed. The annealing process may be performed, for example, in a N$_2$ gas atmosphere at 750-950 degrees Celsius for 30 seconds to 1 minute. During this annealing process, constitutional elements of the lower dielectric film 11 may diffuse into the thin upper dielectric film 13 to thereby form the dielectric film 10' with a double layer structure composed of the lower dielectric film 11' and the upper dielectric film 13' as shown in FIG. 1B.

Alternatively, the multilayered dielectric film 10' of transistors according to the second embodiments of the present invention may also be formed by forming the lower dielectric film 11' made of metal silicate as described above and forming the upper dielectric film 13' made of silicate of a metal constituting the lower dielectric film 11' and a Group III or XIII metal different from the metal constituting the lower dielectric film 11' using an ALD process.

Finally, a gate electrode 20 is formed on the dielectric film 10 or 10'. The gate electrode 20 may be the multilayered gate electrode 20 according to the first or second embodiments shown in FIG. 1A or 1B or the monolayered gate electrode 20 according to the third embodiments shown in FIG. 1C.

The multilayered gate electrode 20 according to the first or second embodiments of the present invention shown in FIG. 1A or 1B may be formed as follows. First, the lower gate electrode 21 is formed on the dielectric film 10 or 10'. The lower gate electrode 21 may be formed as a conductive thin film to reduce and/or prevent degradation of PBTI characteristics and gate depletion. The conductive thin film may be formed, for example, to a thickness of about 100 Angstroms or less. The conductive thin film may be made of a metal such as tungsten, molybdenum, titanium, tantalum, hafnium, zirconium and/or aluminum, as a nitride of the metal, and/or as a metal silicon nitride such as tantalum silicon nitride. The conductive thin film may be formed by, for example, ALD, CVD, PVD (Physical Vapor Deposition) using a metal, metal nitride or metal silicon nitride. The use of ALD or CVD processes may reduce the possibility that the dielectric film 10 or 10' is damaged and may provide high quality films.

Next, the upper gate electrode 23 is formed on the lower gate electrode 21. The upper gate electrode 23 may be made of polysilicon; a metal such as tungsten, molybdenum, titanium, tantalum, hafnium, zirconium and/or aluminum; a silicide of such metals; and/or a polycide. An upper gate electrode 23 made of polysilicon may be formed, for example, via Low-Pressure CVD (LPCVD) using SiH$_2$Cl$_2$ and PH$_3$ gases.

The monolayered gate electrode 20 according to the third embodiments of the present invention shown in FIG. 1C may be designed to reduce and/or prevent degradation of PBTI characteristics and/or gate depletion. Thus, the monolayered gate electrode 20 may be made of a metal such as tungsten, molybdenum, titanium, tantalum, hafnium, zirconium and/or aluminum; a nitride of such metals; a silicon nitride of such metals; a silicide of such metals; etc. The monolayered gate electrode 20 may be formed by ALD, CVD, PVD, etc. The use ALD or CVD may facilitate reducing or preventing damage to the dielectric film 10 or 10' and may provide high quality films.

Hereinafter, certain embodiments of the present invention will be described more specifically with reference to the following experimental examples. A detailed description of matters that can be easily induced by those of ordinary skill in the art will be omitted herein.

EXPERIMENTAL EXAMPLE 1

A lower dielectric film made of hafnium silicate was formed to a thickness of 30 Angstroms on a substrate. An upper dielectric film made of aluminum oxide was then formed by ALD with varying deposition cycle number (one, three and six) to thereby prepare three different types of dielectric film samples. Then, a polysilicon gate electrode was formed on each of the three dielectric film samples. Each resultant sample was subjected to a CMOS process to obtain nMOS and pMOS test samples. The C-V characteristics for each test sample were measured and the results are shown in FIGS. 2A and 2B, where FIG. 2A shows the C-V graphs for the nMOS test samples and FIG. 2B shows the C-V graphs for the pMOS test samples.

Figure 2A:
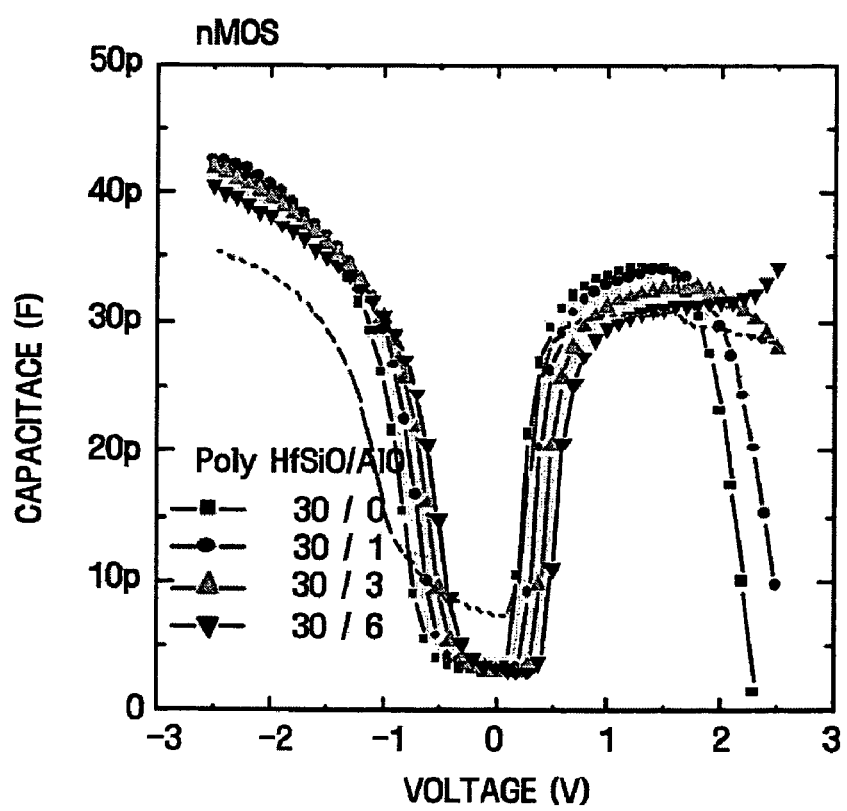
FIGS. 2A and 2B are graphs illustrating the capacitance-voltage (C-V) characteristics of transistors manufactured in Experimental Example 1.
Figure 2B:
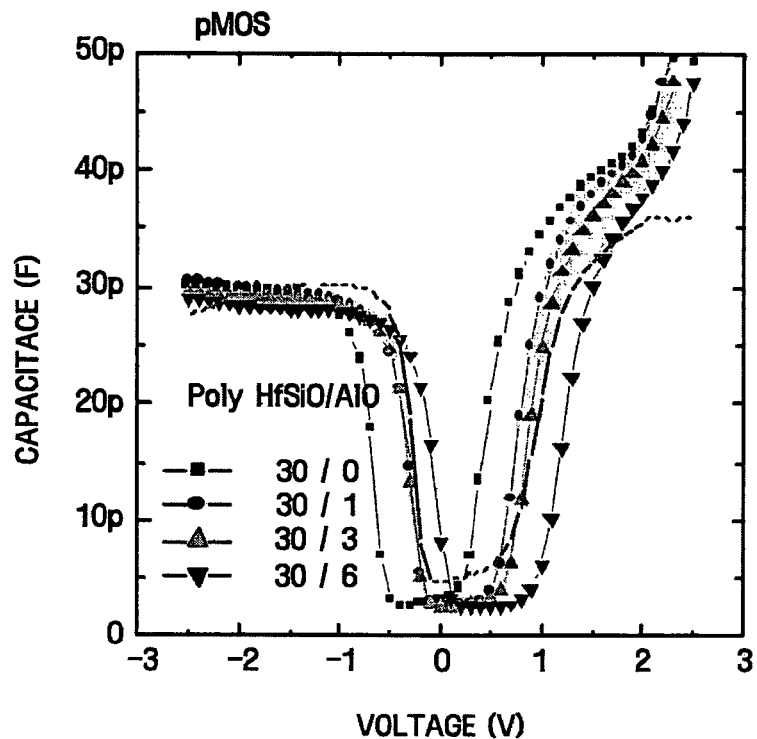

As shown in FIGS. 2A and 2B, as the deposition cycle number for the aluminum oxide film increased, the C-V graphs for both the nMOS and pMOS test samples shifted to a positive direction. This result shows that an upper dielectric film made of aluminum oxide which is Group III metal oxide may exhibit substantially similar threshold voltage characteristics to a dielectric film made of SiON since it increases the threshold voltage of nMOS and decreases the threshold voltage of pMOS.

EXPERIMENTAL EXAMPLE 2

The effect of an upper dielectric film on a threshold voltage was evaluated in the same manner as in Experimental Example 1 as follows. First, a lower dielectric film made of hafnium silicate was formed to a thickness of 30 Angstroms on a substrate. An upper dielectric film made of aluminum oxide was then formed by ALD with varying deposition cycle number (one, three and six) to thereby prepare three types of dielectric film samples. Then, a multilayered gate electrode composed of a lower gate electrode and an upper gate electrode was formed on the dielectric film samples. The lower gate electrode was formed to a thickness of 40 Angstroms as a titanium nitride film, and the upper gate electrode was formed as a doped polysilicon film. Each resultant sample was subjected to a CMOS process to form nMOS and pMOS test samples. The C-V characteristics for each test sample were measured and the results are shown in FIGS. 3A and 3B, where FIG. 3A shows the C-V graphs for the nMOS test samples and FIG. 3B shows the C-V graphs for the pMOS test samples.

Figure 3A:
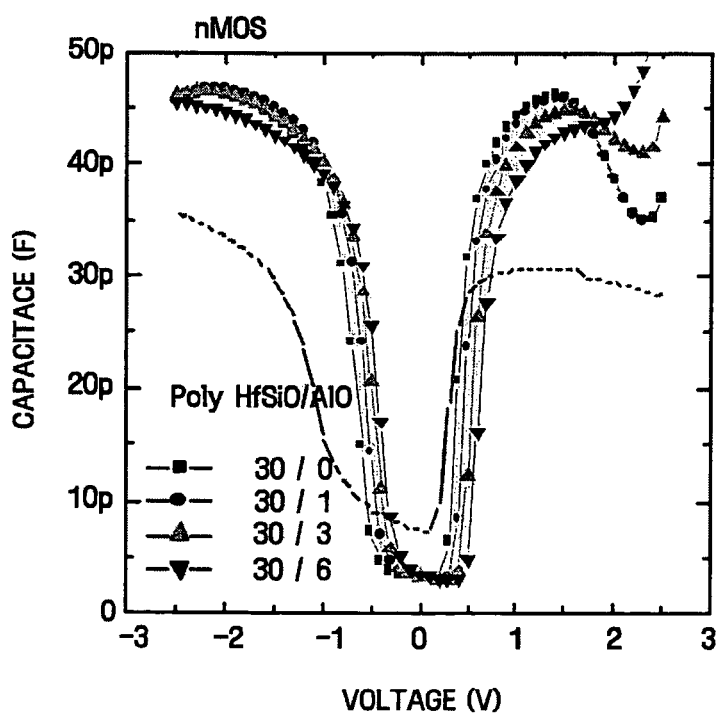
FIGS. 3A and 3B are graphs illustrating the C-V characteristics of transistors manufactured in Experimental Example 2.
Figure 3B:
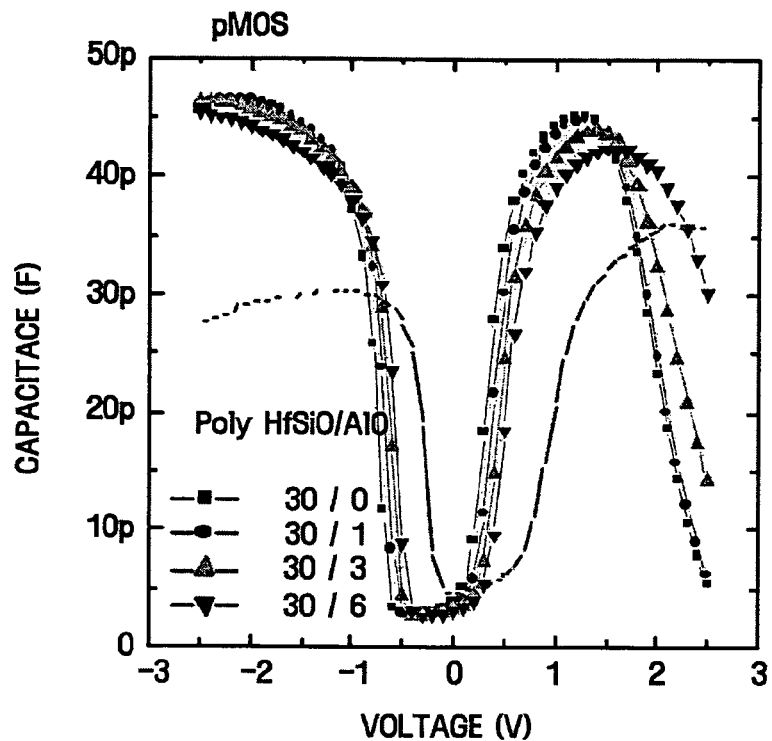

As shown in FIGS. 3A and 3B, as the deposition cycle number for the aluminum oxide film increased, the C-V graphs for both the nMOS and pMOS test samples shifted to a positive direction. Like in Experimental Example 1, this result shows that an upper dielectric film made of aluminum oxide, which is Group III metal oxide may exhibit substantially similar threshold voltage characteristics to a dielectric film made of SiON since it increases the threshold voltage of nMOS devices and decreases the threshold voltage of pMOS devices.

A comparison of the results of FIGS. 2A and 2B to the results of FIGS. 3A and 3B reveals that less gate depletion was observed in the test samples using the multilayered gate electrode composed of the titanium nitride film and the polysilicon film as compared to the test samples that used a polysilicon gate electrode. That is, in the test samples using the multilayered gate electrode composed of the titanium nitride film and the polysilicon film compared to the test samples using the polysilicon gate electrode, a capacitance in an inversion region where a device was actually operated increased and a CET (Capacitive Equivalent Thickness) gain of about 5 Angstroms was obtained at the same leakage current. Thus, in certain embodiments of the present invention, an upper dielectric film made of aluminum oxide may enhance the threshold voltage characteristics of CMOS devices, and a conductive thin film (titanium nitride film) formed on a dielectric film can sufficiently reduce and/or prevent the depletion of an upper gate electrode made of polysilicon.

EXPERIMENTAL EXAMPLE 3

Figure 4A:
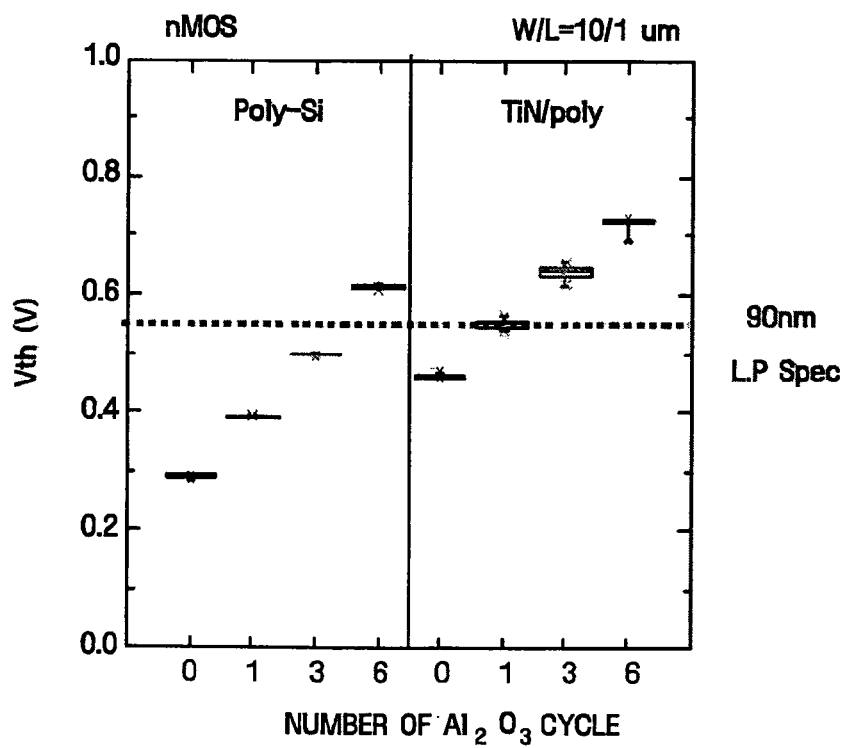
FIGS. 4A and 4B are graphs illustrating the threshold voltage characteristics of the transistors manufactured in Experimental Examples 1 and 2.
Figure 4B:
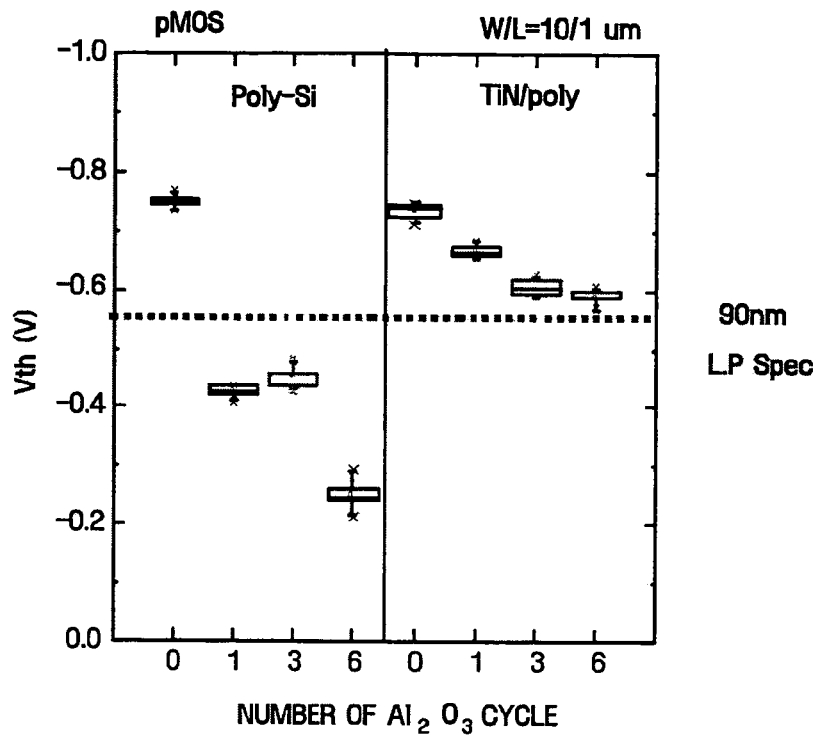

The threshold voltage characteristics of the test samples prepared in Experimental Examples 1 and 2 were evaluated and the results are shown in FIGS. 4A and 4B. Referring to FIGS. 4A and 4B, the threshold voltages of the nMOS samples increased and the threshold voltages of the pMOS samples decreased to thereby approximate the threshold voltages of nMOS and pMOS devices using a SiON dielectric film.

EXPERIMENTAL EXAMPLE 4

Figure 5A:
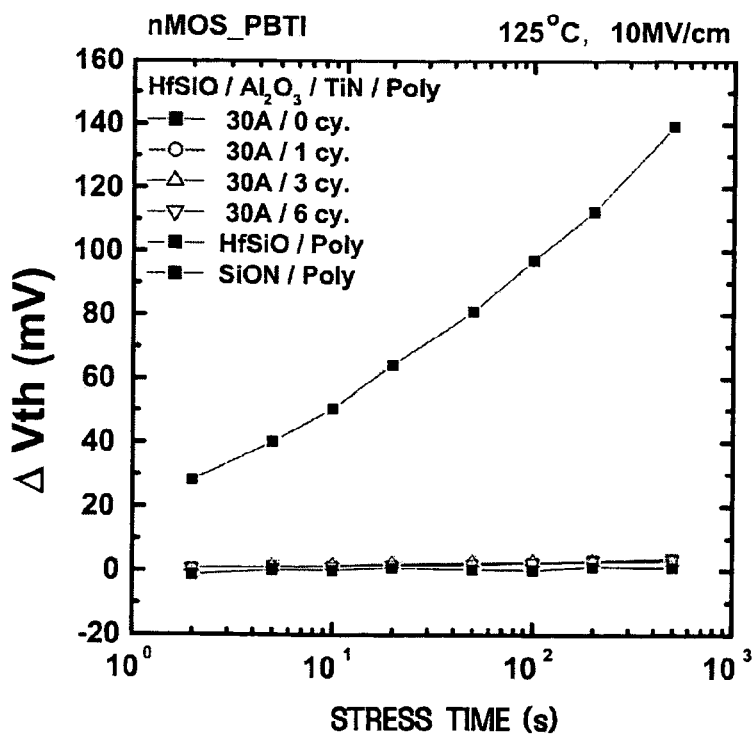
FIGS. 5A and 5B are graphs illustrating the Bias Temperature Instability (BTI) characteristics of the transistors manufactured in Experimental Examples 1 and 2.
Figure 5B:
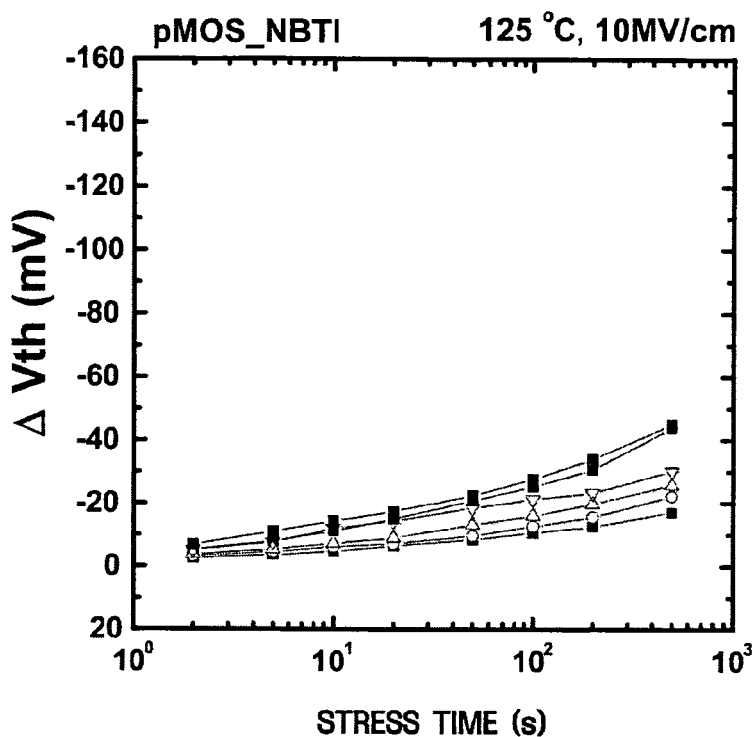

The BTI characteristics of the test samples prepared in Experimental Examples 1 and 2 were evaluated and the results are shown in FIGS. 5A and 5B. The BTI characteristics were represented by threshold voltage shift ($\Delta Vth$) derived from Id-Vg curves swept under 10 MV/cm voltage stress conditions.

Referring to FIG. 5A, the PBTI characteristics of the nMOS test samples including the lower dielectric film made of hafnium silicate, the upper dielectric film made of aluminum oxide, the lower gate electrode made of titanium nitride, and the upper gate electrode made of polysilicon were hardly degraded, unlike conventional nMOS samples including a dielectric film made of hafnium silicate and a polysilicon gate electrode, and were almost the same level as those of nMOS samples including a SiON dielectric film and a polysilicon gate electrode.

Referring to FIG. 5B, the pMOS samples including the lower dielectric film made of hafnium silicate, the upper dielectric film made of aluminum oxide, the lower gate electrode made of titanium nitride, and the upper gate electrode made of polysilicon exhibited a smaller threshold voltage shift and less degradation of NBTI characteristics, as compared to pMOS samples including a SiON dielectric film and a polysilicon gate electrode and pMOS samples including a hafnium silicate dielectric film and a polysilicon gate electrode.

The enhancement in the BTI characteristics of the nMOS and pMOS samples may result from the lower gate electrode made of titanium nitride acting as a diffusion barrier preventing the diffusion of dopants of the upper gate electrode made of polysilicon and fundamentally reducing charge trapping.

EXPERIMENTAL EXAMPLE 5

A lower dielectric film made of hafnium silicate was formed to a thickness of 50 Angstroms on a substrate. An upper dielectric film made of aluminum oxide was then formed by ALD with varying deposition cycle number (one and six) to thereby prepare two types of dielectric film samples. The dielectric film samples were then annealed at 950 degrees Celsius for 30 seconds and XPS (X-ray Photoelectron Spectroscopy) analysis for the resultant samples was performed. The analysis results are shown in FIGS. 6A and 6B.

Figure 6A:
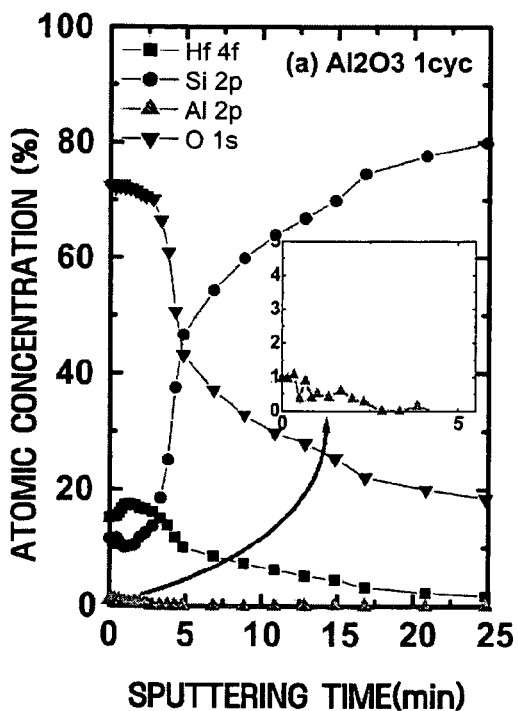
FIGS. 6A and 6B are graphs illustrating XPS (X-ray Photoelectron Spectroscopy) analysis results of dielectric films formed in Experimental Example 5.
Figure 6B:
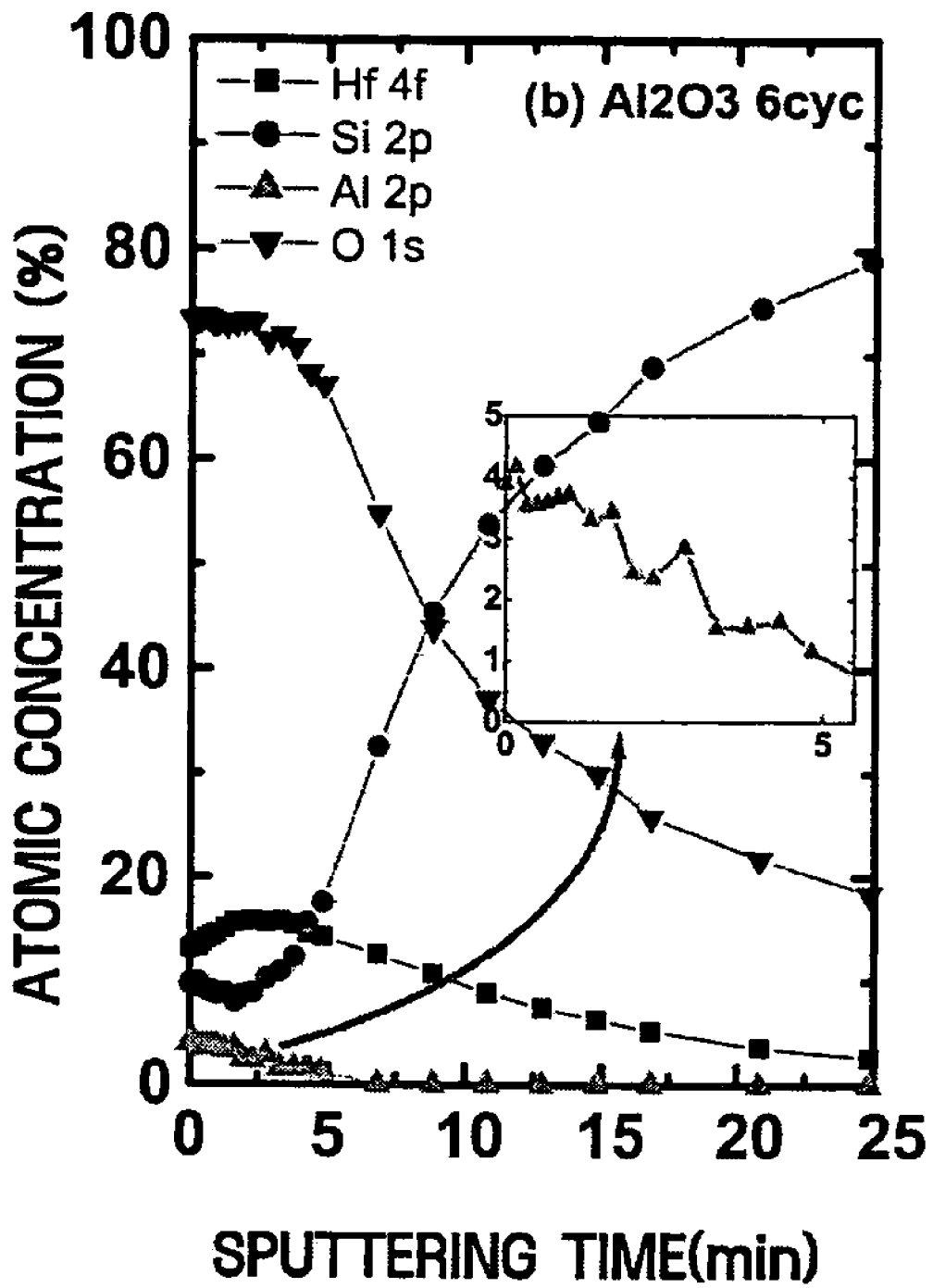

Referring to FIGS. 6A and 6B, when the aluminum oxide film was formed by one deposition cycle, an aluminum peak atomic concentration (%) of the surface of the aluminum oxide film was 1.06%. On the other hand, when the aluminum oxide film was formed by six deposition cycles, an aluminum peak atomic concentration (%) of the surface of the aluminum oxide film was 4.16%.

In addition, FIGS. 6A and 6B show that hafnium and silicon constituting the lower dielectric film diffused into the upper dielectric film and, as a result, the upper dielectric film was modified into a dielectric film made of hafnium aluminum silicate. This result shows that a dielectric film can have a double layer structure composed of a hafnium silicate ($H_{1-x}Si_xO_2$) lower dielectric film and a hafnium aluminum silicate ($Hf_aAl_bSi_cO_2$) upper dielectric film.

Embodiments of the present invention may provide nMOS transistors having increased threshold voltages pMOS transistors having decreased threshold voltages. In addition, the CMOS transistors may exhibit reduced gate depletion and reduced degradation of BTI characteristics.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor comprising:
a multilayered dielectric film on a channel region provided between a source region and a drain region, the multilayered dielectric film comprising:
a lower dielectric film having a thickness that is at least 50% a thickness of the multilayered dielectric film, the lower dielectric film comprising a metal oxide, a metal silicate and/or an aluminate; and
an upper dielectric film, on the lower dielectric film, the upper dielectric film comprising a Group XIII metal oxide; and
a gate electrode on the multilayered dielectric film,
wherein the thickness of the upper dielectric film is less than 10 Angstroms.

2. The transistor of claim 1, wherein the lower dielectric film comprises an aluminate that contains aluminum and at least one additional metal.

3. The transistor of claim 2, wherein the aluminate is represented by $M_{1-x}Al_yO_z$ where M is hafnium, zirconium, tantalum, titanium, strontium, barium, scandium, yttrium or lanthanum.

4. The transistor of claim 1, wherein the lower dielectric film comprises titanium oxide ($TiO_2$), aluminum oxide ($Al_2O_3$), gadolinium oxide ($Gd_2O_3$) or yttrium oxide ($Y_2O_3$), or a metal silicate represented by $M_{1-x}Si_xO_2$ where M is tantalum (Ta), titanium (Ti), strontium (Sr), barium (Ba), scandium (Sc), yttrium (Y) or lanthanum (La).

5. The transistor of claim 4, wherein the upper dielectric film comprises aluminum oxide.

6. The transistor of claim 5, wherein the gate electrode is a multilayered gate electrode comprising:
a metal nitride or a metal silicon nitride lower gate electrode; and
a polysilicon upper gate electrode on the lower gate electrode.

7. The transistor of claim 6, wherein the lower gate electrode comprises titanium nitride.

8. The transistor of claim 7, further comprising a $SiO_2$ film or a SiON film on a lower surface of the lower dielectric film, wherein the lower dielectric film comprises a material different than $SiO_2$ or SiON.

9. The transistor of claim 1, wherein the gate electrode is a multilayered gate electrode comprising:
a metal, metal nitride or metal silicon nitride lower gate electrode; and
a polycide upper gate electrode on the lower gate electrode.

10. The transistor of claim 9, wherein the lower gate electrode comprises aluminum nitride, tungsten silicon nitride, molybdenum silicon nitride, titanium silicon nitride, or aluminum silicon nitride.

11. The transistor of claim 5, wherein the gate electrode is a multilayered gate electrode comprising:
a metal nitride lower gate electrode; and
a polycide upper gate electrode on the lower gate electrode.

12. The transistor of claim 1, wherein the transistor comprises an NMOS transistor.

13. A CMOS device comprising:
a PMOS channel region and an NMOS channel region; and
a multilayered dielectric film on the NMOS and PMOS channel regions, the multilayered dielectric film comprising:
a lower dielectric film having a thickness that is at least 50% a thickness of the multilayered dielectric film, the lower dielectric film comprising an aluminate; and
an upper dielectric film, on the lower dielectric film, the upper dielectric film comprising a Group XIII metal oxide and having a thickness less than 10 Angstroms; and
a gate electrode on the multilayered dielectric film.

14. The CMOS device of claim 13, wherein the aluminate is represented by $M_{1-x}Al_yO_z$ where M is hafnium, zirconium, tantalum, titanium, strontium, barium, scandium, yttrium or lanthanum, and wherein the upper dielectric film comprises aluminum nitride.

15. The CMOS device of claim 14, wherein the gate electrode is a multilayered gate electrode comprising:
an aluminum nitride, tungsten silicon nitride, molybdenum silicon nitride, titanium silicon nitride, or aluminum silicon nitride lower gate electrode; and
a polycide upper gate electrode on the lower gate electrode.

16. The CMOS device of claim 15, further comprising a $SiO_2$ film or a SiON film on a lower surface of the lower dielectric film.

* * * * *